US006959093B2

(12) United States Patent
McWilliam

(10) Patent No.: US 6,959,093 B2
(45) Date of Patent: Oct. 25, 2005

(54) LOW FREQUENCY ACTIVE NOISE CONTROL

(75) Inventor: Richard Donald McWilliam, Shedden (CA)

(73) Assignee: Siemens VDO Automotive Inc., Chatham, CA (US)

( * ) Notice: Subject to any disclaimer, the term of this patent is extended or adjusted under 35 U.S.C. 154(b) by 536 days.

(21) Appl. No.: 10/106,077

(22) Filed: Mar. 26, 2002

(65) Prior Publication Data

US 2002/0150260 A1 Oct. 17, 2002

Related U.S. Application Data

(60) Provisional application No. 60/283,554, filed on Apr. 12, 2001.

(51) Int. Cl.[7] ................................................ H03B 29/00

(52) U.S. Cl. ...................... 381/71.4; 381/71.5; 381/340

(58) Field of Search .............................. 381/71.1, 71.4, 381/71.5, 71.9, 71.14; 415/119

(56) References Cited

U.S. PATENT DOCUMENTS 5,386,689 A * 2/1995 Bozich et al. .............. 415/119
5,446,790 A * 8/1995 Tanaka et al. ........... 381/71.14
5,828,759 A 10/1998 Everingham
5,850,458 A * 12/1998 Tomisawa et al. ......... 381/71.4
5,860,400 A 1/1999 Stuart et al.
6,084,971 A 7/2000 McLean

* cited by examiner

*Primary Examiner*—Brian T. Pendleton

(57) ABSTRACT

A noise attenuation system (10) for an air induction system (12) includes an air inlet duct (16) having an open end (18) to draw in air and a loudspeaker (22) mounted within the inlet duct (16) and facing the open end (18) of the inlet duct (16). The air horn (24) is connected to the loudspeaker (22) to tune the sound output and increase the sound power from the loudspeaker (22) to optimize cancellation of noise generated by the air induction system (16) at lower frequencies. An open end (18) of the air horn (24) is positioned within a plane defined by the open end (18) of the air inlet duct (16). A microphone (26) is positioned near the air inlet duct (16) and is in communication with a controller (28). The controller (28) generates an input to the loudspeaker (22). The input to the loudspeaker (22) is out of phase with the noise detected by the microphones (26) to cancel a portion of noise emitted from the open end (18) of the air inlet (16).

19 Claims, 2 Drawing Sheets

LOW FREQUENCY ACTIVE NOISE CONTROL

This application claims the benefit of Provisional application Ser. No. 60/283,554, filed Apr. 12, 2001.

BACKGROUND OF THE INVENTION

This invention relates generally to an active noise control system for attenuating noise emanating from an air induction system of an internal combustion engine.

Internal combustion engines include intake and exhaust valves that rapidly open at specific intervals to introduce a fuel air mixture into a combustion chamber, and to subsequently exhaust waste gases. A major source of noise emanating from an engine is generated from the sudden opening and closing of the intake and exhaust valves during the combustion cycle. The sudden opening and closing of the intake and exhaust valves create acoustic waves due to inertia of the gas streams in the connected passages. A compression zone created near the suddenly closed valve caused by the continued inertia of the incoming stream of the gases propagates an acoustic wave back through the intake manifold passages. This emanates from the air intake inlet as undesirable noise.

Prior art systems for actively controlling the undesirable noise emanating from the air intake include a loudspeaker for generating a sound out of phase with the noise emanating from the air intake system. A microphone disposed near the air inlet detects the noise within the air induction system and a controller generates an input to the loudspeaker to create a sound out of phase with the noise from the engine. The out of phase sound generated by the loudspeaker cancels a substantial amount of audible noise. However, these systems are limited by practical application limitations including speaker size and available power limitations.

Size limitations are most dramatic for active noise control systems used to abate noises at lower frequencies. Typically, the lower frequency noise emanating from the air intake manifold are the most undesirable, while also being the most difficult to abate.

Accordingly, it is desirable to develop an active noise control system able to abate the undesirable lower frequency noises within practical size and power limitations of the loudspeaker.

SUMMARY OF THE INVENTION

This invention is an active noise control system for attenuating noise emitted from an air induction system including a loudspeaker connected to an air horn to magnify the sound output of the loudspeaker.

The noise attenuation system includes an air inlet duct having an open end through which air is drawn into the air induction system. The air induction system feeds air into an internal combustion engine. The air horn is preferably positioned concentrically within the air inlet duct and preferably includes an outlet positioned within a plane defined by an open end of the inlet duct. A loudspeaker is connected to the air horn and produces a canceling sound that is transmitted through the air horn. The most undesirable noises emitted from the engine are typically of a lower frequency. A loudspeaker generating enough sound power to overcome or provide a canceling effect to the emitted noise from the engine would be impractically large. The large size of the loudspeaker required to cancel the lower frequency noises has inhibited the application of active noise control in vehicles with larger engines that produce undesirable noise at the lower frequencies.

The air horn increases the sound power of the loudspeaker, allowing a smaller loudspeaker to generate a canceling sound comparable to that of a loudspeaker several times its size.

The outlet end of the air horn is preferably positioned within a plane defined by the inlet of the air inlet duct. This position optimizes the noise cancellation obtained by the sound output of the loudspeaker. As appreciated, if the outlet end of the air horn was positioned within the air inlet duct, sound waves emanating from the air horn might bounce off the interior walls of the air inlet duct reducing the cancellation effect of the sound generated from the loudspeaker.

A sound detector is mounted near the air inlet duct and is in electrical communication with a controller. The controller generates an input signal to the loudspeaker to control the frequency of sound generated by the loudspeaker. The controller is also in communication with an engine rpm sensor. The controller uses the data from the sound detectors and from the engine rpm sensor to generate an input to the loudspeaker. The input to the loudspeaker is 180° out of phase with the frequency of noise generated by the engine. The out of phase sound produced by the loudspeaker produces the canceling effect that reduces the overall noise emanating from the air induction system.

The noise control system of this invention provides for the cancellation of a substantial amount of undesirable lower frequency noises within practical size and power limitations.

BRIEF DESCRIPTION OF THE DRAWINGS

The various features and advantages of this invention will become apparent to those skilled in the art from the following detailed description of the currently preferred embodiment. The drawings that accompany the detailed description can be briefly described as follows.

DETAILED DESCRIPTION OF THE PREFERRED EMBODIMENT

Figure 1:
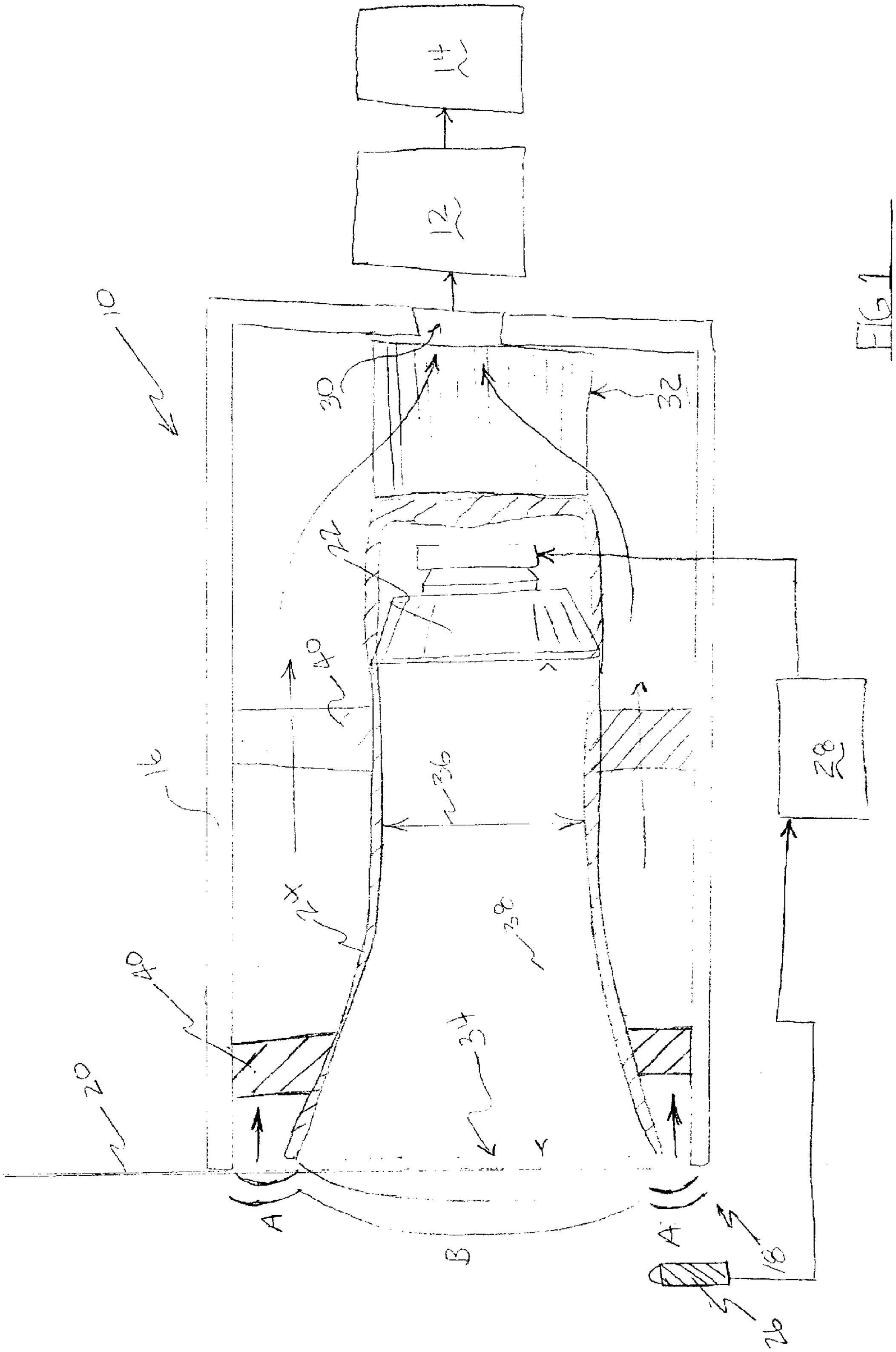
FIG. 1 is a cross-sectional view of a noise attenuation system.

Referring to the Figures, wherein like numerals indicate like or corresponding parts throughout the several views, FIG. 1 is a cross-sectional view of a noise attenuation system 10 for an air induction system 12 for an internal combustion engine 14. The attenuation system 10 is enclosed within an air inlet duct 16. The air inlet duct 16 includes an open end 18 into which air is drawn and passed to an outlet opening 30. Noise created by the rapidly opening and closing of intake and exhaust valves of the engine 14 propagate acoustic waves that transmit back through the air induction system 12 and out the open end 18. Note that the air inlet duct 16 is shown as rectangular hollow body. However, it is within the contemplation of this invention that the air inlet duct 16 may take any shape as shown to one skilled in the art and as required by specific application.

Mounted within the air inlet duct 16 is a loudspeaker 22. The loudspeaker 22 is electrically connected with a controller 28. The controller 28 is also in communication with at least one microphone 26. The microphone 26 detects noises emanating from the engine 14 and transmitted through the air induction system 12 and the air inlet duct 16. The characteristics of the detected noise are communicated to the controller 28 which in turn generates an input signal to drive the loudspeaker 22. The sound generated by the loudspeaker 22 is 180° out of phase with the noise generated from the engine 14 and transmitted through the air inlet duct 16. Specifically, the frequency of the noise generated and transmitted through the air induction system 12 is detected by the microphones 26. The controller 28 then generates a noise with a frequency 180° out of phase from the noise detected by the microphones 26. The out of phase noise frequency generated by the loudspeaker 22 emanates from an air horn 24. This aspect of the invention is generally known in the art.

The air horn and speaker 24,22 are preferably mounted concentrically within the air inlet duct 16. Supports 40 are disposed within the air inlet duct 16 to support the air horn and loudspeaker 24, 22.

Figure 3:
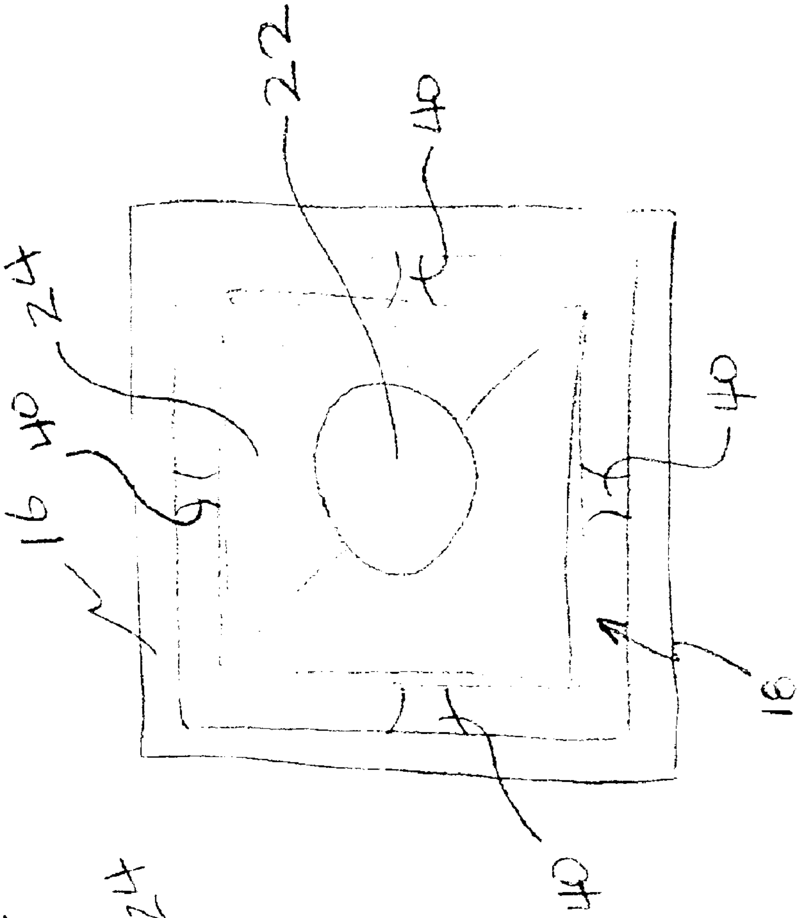
FIG. 3 is a front view of another embodiment of the noise attenuation system.
Figure 2:
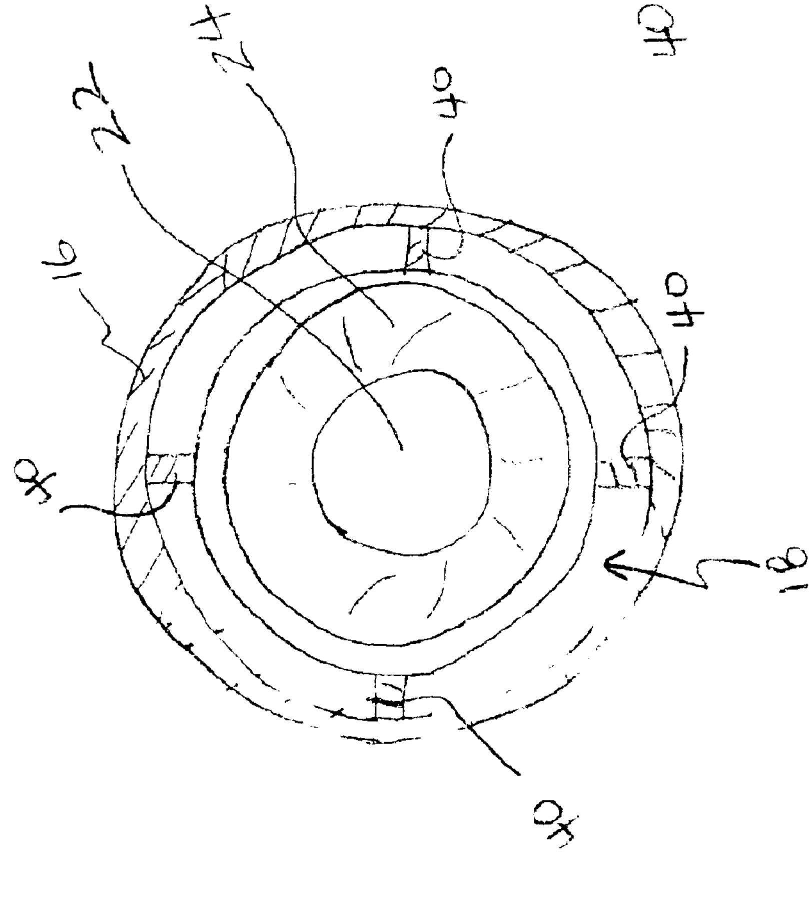
FIG. 2 is a front view of the noise attenuation system.

The open end 18 for air drawn through the air inlet duct 16 is formed between the open end 34 of the air horn 24 and the inner periphery of air inlet duct 16. Preferably, the open end 18 formed between the air horn 24 and air inlet duct 16 is annular as is shown in FIG. 2. However, as shown in FIG. 3, the air inlet duct 16 may take any shape as would be known to a worker skilled in the art such as a rectangular shape as is shown in FIG. 3.

Air drawn into the air inlet duct 16, as indicated by arrows, is directed around the air horn 24 and loudspeaker 22 through a filter 32 and out an outlet 30. The air is then drawn into the air induction system 12 which is used to mix with fuel for the engine 14.

The open end 34 of the air horn 24 is disposed substantially within a plane defined by the open end 18. Noise propagating from the air induction system and transmitted through the air inlet duct 16 is shown schematically at A. Sound generated by the loudspeaker 22 and transmitted through the air horn 24 is shown schematically at B. Transmitting sound from the loudspeaker 22 through the open end 34 of the air horn 24 at a plane 20 defined by the open end 18 provides optimal sound cancellation. As appreciated, if the open end 34 of the air horn 24 was disposed in a non-planar arrangement with the open end 18, the sound generated by the loudspeaker 22 and emitted through the open end 34 might mix with the sound A generated from the air induction system 12 and not provide optimal cancellation. This is so because sound waves generated by the loudspeaker 22 and emitted from the open end 34 of air horn 24 might bounce against the inner walls of the inlet 16 thereby creating additional noise and reducing the amount of sound power directed at canceling noise indicated at A.

The addition of the air horn 24 to the loudspeaker 22 provides for an increase in sound power within the lower frequency ranges. Absent the air horn 24, the loudspeaker 22 would have to be of a much larger size to provide the same sound power output to cancel noise indicated at A generated from the air induction system 12 and engine 14. The addition of the air horn 24 allows for a much smaller loudspeaker 22 to be used in applications especially requiring cancellation of lower frequency noise. Further, lower frequency noise generated by the air induction system 12 and engine 14 are the most undesirable and therefore require cancellation. As an example of how the air horn 24 optimizes the use of the loudspeaker 22 for low frequency noise emitted from the air induction system 12 and engine 14, without the air horn 24, the loudspeaker 22 would need to be approximately 15 inches in diameter. With inclusion of the air horn 24 to the loudspeaker 22, the same noise power at specific lower frequencies can be generated with a 4 inch diameter speaker. Generally, the use of the noise attenuation system 10 will lower the sound output at the open end 18 by between 15 and 20 decibels.

Attaching the air horn 24 to the loudspeaker 22 results in an increase in acoustic output at low frequencies. The air horn 24 acts as an acoustic transformer matching the impedance of the loudspeaker 22 to that of the air. The low frequency acoustic assistance at the throat of the air horn 24 is greater than that acting on a loudspeaker of equal size generating sound without the air horn 24.

The air horn 24 includes a length 38 and an inner diameter 36. Preferably, the inner diameter 36 defines a cross-sectional area which increases with the distance from the loudspeaker 22. The shape of an air horn 24 may be of any type chat would be known to a worker skilled in the art such as hyperbola or exponential shape. In other words, the air horn 24 is preferably of a cross-section that increases directly with distance from the loudspeaker 22. A worker in the art would understand how to configure the specific cross-sectional area of the air horn 24 and specifically the change in cross-sectional area along the length 38 of the air horn 24 provides the desired sound power to cancel noise generated and transmitted to the air inlet duct 16.

The controller 28 communicates with sound detectors to generate canceling sound transmitted from the loudspeaker 22. The sound detectors are preferably microphones 26 that are disposed within the air inlet duct 16. The specific position of the microphones 26 close to the plane 20 as possible such that false noise readings will not be transmitted to the controller 28 caused by sound waves bouncing off internal structures of the air inlet duct such as the supports 40. In addiction to obtaining noise data from the microphones 26, the controller 28 may receive data from the engine 14 concerning engine rpm. The controller 28 will then further tailor the generated electrical signals to the loudspeaker 22 to provide for a better and optimal canceling effect of the noise A.

The foregoing description is exemplary and not just a material specification. The invention has been described in an illustrative manner, and should be understood that the terminology used is intended to be in the nature of words of description rather than of limitation. Many modifications and variations of the present invention are possible in light of the above teachings. The preferred embodiments of this invention have been disclosed, however, one of ordinary skill in the art would recognize that certain modifications are within the scope of this invention. It is understood that within the scope of the appended claims, the invention may be practiced otherwise than as specifically described. For that reason the following claims should be studied to determine the true scope and content of this invention.

What is claimed is:

1. A noise attenuation system for an air induction system comprising;

an air inlet duct having an open end into which air is drawn;

a loudspeaker mounted within said air inlet duct facing said open end of said air inlet duct;

an air horn associated with said loudspeaker to tune sound output from said loudspeaker;

a sound detector associated with said air induction system to produce an electrical signal corresponding to noise emitted from said air induction system; and a controller in communication with said sound detector to provide an input to said loudspeaker that operates to cancel a portion of noise emitted from said air induction system.

2. The system of claim 1, wherein said air horn includes an outlet end positioned substantially within a plane defined by said open end of said air inlet duct.

3. The system of claim 2, wherein said air horn outlet end is mounted concentrically with said open end of said air duct.

4. The system of claim 1, further including an air inlet defined between an outer periphery of said outlet end of said air horn and said air inlet duct.

5. The system of claim 4, wherein said air inlet duct is annular.

6. The system of claim 4, wherein said air inlet duct is rectangular.

7. The system of claim 1, wherein an inner surface of said air horn defines a cross-sectional area, said cross-sectional area varies relative to a distance from said loudspeaker.

8. The system of claim 7, wherein said cross-sectional area defines a hyperbolic shape.

9. The system of claim 7, wherein said cross-sectional area defines an exponential shape.

10. The system of claim 1, wherein said air inlet duct includes an outlet in communication with said air induction system and an air filter associated with said outlet.

11. The system of claim 1, wherein said sound detector is a microphone mounted within said air inlet duct.

12. An air induction system for an internal combustion engine comprising:

an air inlet duct having an open end defining a plane into which air is drawn;

a loudspeaker mounted within said air inlet duct facing said open end of said air inlet duct;

an air horn associated with said loudspeaker to time sound output from said loudspeaker, said air horn including an outlet substantially within said plane defined by said open end of said air inlet duct;

a sound detector associated with said air induction system to produce an electrical signal corresponding to noise emitted from said air induction system; and a controller in communication with said sound detector to provide an input to said loudspeaker that operates to cancel a portion of noise emitted through said air inlet duct.

13. The system of claim 12, wherein said outlet of said air horn is mounted concentrically with said open end of said air inlet duct.

14. The system of claim 12, wherein said air horn defines a cross-sectional area, said cross-sectional area increasing relative to an increased distance from said loudspeaker.

15. The system of claim 12, wherein said loudspeaker emits a sound approximately 180 degrees out or phase with noise emitted through said air induction system to cancel a portion of noise emitted through said air inlet duct.

16. The system or claim 13, wherein said air inlet duct includes an outlet in communication with said internal combustion engine, said outlet including an air filter.

17. The system of claim 12, wherein said sensor is a microphone mounted near said air inlet duct.

18. A method of attenuating noise emanating from an air inlet opening of an air induction system comprising the steps of;

a. detecting noise within an air inlet duct of the air induction system;

b. generating electrical signals to drive a loudspeaker according to properties of the detected noise within the air inlet duct;

c. emitting sound from the loudspeaker through an air horn to increase sound output at low frequencies, wherein aid air horn includes an outlet disposed within a plane defined by an opening of the air inlet duct.

19. The method of claim 18, wherein said step c. is further defined by emitting a sound from the loudspeaker out of phase with the detected noise.

* * * * *